United States Patent
Ye

(10) Patent No.: US 9,073,747 B2
(45) Date of Patent: Jul. 7, 2015

(54) MEMS MICROPHONE AND ELECTRONIC EQUIPMENT HAVING THE MEMS MICROPHONE

(71) Applicants: Shangai Sniper Microelectronics Co., Ltd., Shanghai (CN); Zilltek Technology Corp., Hsinchu (TW)

(72) Inventor: Jinghua Ye, Shanghai (CN)

(73) Assignee: SHANGAI SNIPER MICROELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 14/019,768

(22) Filed: Sep. 6, 2013

(65) Prior Publication Data
US 2014/0353779 A1    Dec. 4, 2014

(30) Foreign Application Priority Data

May 28, 2013    (CN) .......................... 2013 1 0205605

(51) Int. Cl.
*H04R 25/00* (2006.01)
*B81B 3/00* (2006.01)
(52) U.S. Cl.
CPC ................................... *B81B 3/0021* (2013.01)
(58) Field of Classification Search
CPC ........... H04R 23/006; H04R 2201/003; B81B 3/0021

USPC .................. 381/345, 355, 351, 361, 174, 175
See application file for complete search history.

(56) References Cited

U.S. PATENT DOCUMENTS

2006/0237806 A1    10/2006    Martin et al.
2013/0136291 A1 *   5/2013    Lee et al. ...................... 381/355

FOREIGN PATENT DOCUMENTS

CN    102714772    10/2010

* cited by examiner

*Primary Examiner* — Tuan D Nguyen
(74) *Attorney, Agent, or Firm* — Terry M. Sanks, Esq.; Beusse Wolter Sanks & Maire, P.A.

(57) ABSTRACT

The present invention provides a MEMS microphone and an electronic equipment having the MEMS microphone. The electronic equipment of the present invention at least comprises: a MEMS microphone and a printed circuit board, wherein, the microphone comprises: a microphone chip containing acoustic and electric sensor, a package shell packaging the microphone chip, wherein, it is provided a sound hole on the package shell, the sound hole is positioned on the side of the microphone chip, it is also provided pins derived from the microphone chip on the side face of the package shell adjacent to the sound hole; the printed circuit board electrically connect with the pins of the MEMS microphone, which is used to output the electric signal generated by the microphone. The present invention avoids the sound air flow directly to the microphone chip, reduces dust interference on acoustic and electric sensor in microphone chip by means of changing the position of the sound hole of the microphone.

6 Claims, 2 Drawing Sheets

MEMS MICROPHONE AND ELECTRONIC EQUIPMENT HAVING THE MEMS MICROPHONE

TECHNICAL FIELD

The invention relates to a MEMS microphone, in particular to a MEMS microphone and an electronic equipment having the MEMS microphone.

TECHNICAL BACKGROUND

With the rapid development of electronic equipment, a market demand of miniaturization and high quality of electronic equipment is becoming larger. At present, the structure of the MEMS microphone in electronic equipment is shown in FIG. 1, the MEMS microphone comprises: a microphone chip 12, and a package shell 11 packaging the microphone chip, there is a sound hole 111 provided on the package shell, wherein, the sound hole is positioned on the side face of the microphone chip relative to the pin 112. It needs to provide space for installing the MEMS microphone in the electronic equipment, when the MEMS microphone above is installed in the electronic equipment.

To reduce the space of the above MEMS microphone in the electronic equipment, at present, a common method is to reduce the size of MEMS microphone by using integrated circuits, and to reduce the space of MEMS microphone by optimizing the layout. But for MEMS microphones, the above methods not only make the cost of MEMS microphone increase, but also causes following problems: since the current sound hole of MEMS microphone is above the microphone chip, the air flow generated in use will make the dust into the sound hole, and block the sound hole and the microphone chip, thus, it leads the voice effect of the microphone chip getting bad. Therefore, it needs to improve the current structure of the MEMS microphone.

CONTENT OF THE INVENTION

In view of the disadvantages of the prior art above, the present invention aims to provide a MEMS microphone and an electronic equipment having the MEMS microphone, for solving the problems, in which the air flow make the dust into the sound hole when people speak to the sound hole of MEMS microphone, to lead the voice effect of the microphone bad in the prior art.

In order to realize the above purpose and other related purpose, the present invention provides a MEMS microphone, which at least comprises: microphone chip containing acoustic and electric sensor, to convert sound waves into change of plate spacing of capacitance in the acoustic and electric sensor, and output electric signal about the change of voltage according to the change of plate spacing; package shell packaging the microphone chip, wherein, it is provided a sound hole on the package shell, the sound hole is positioned on the side face of the microphone chip, meanwhile, it is also provided pin derived from the microphone chip on the side face of the package shell adjacent to the sound hole.

Preferably, the MEMS microphone also comprises: a dustproof component which is over the acoustic and electric sensor.

Preferably, the material of the dustproof component is siliceous material.

Based on the above purpose, the present invention also provides an electronic equipment having the MEMS microphone, which at least comprises: the MEMS microphone comprises: a microphone chip containing acoustic and an electric sensor, converting sound waves into change of plate spacing of capacitance in the acoustic and electric sensor, and output electric signal about the change of voltage according to the change of plate spacing; a package shell packaging the microphone chip, wherein, it is provided a sound hole on the package shell, the sound hole is positioned on the side face of the microphone chip, meanwhile, it is also provided pins derived from the microphone chip on the side face of the package shell adjacent to the sound hole;

A printed circuit board electrically connecting with the pins of the MEMS microphone, to output the electric signal generated by the microphone.

Preferably, the electronic equipment also comprises: washer which is attached to the package shell and at the end face adjacent to the sound hole.

Preferably, the MEMS microphone also comprises: dustproof component which is over the acoustic and electric sensor.

Preferably, the material of the dustproof component is siliceous material.

Preferably, the printed circuit board has the space for containing the MEMS microphone, and leaving gap between the sound hole of MEMS microphone and the boundary of the space.

As mentioned above, the MEMS microphone and an electronic equipment having the MEMS microphone of the present invention, has following advantages: by means of changing the position of the sound hole of the microphone, it can avoid the sound air flow directly to the microphone chip, reduces dust interference on acoustic and electric sensor in the microphone chip; in addition, the washer directly attached to the shell of MEMS microphone, not only effectively reduces the size of the electronic equipment, also enhances the protection effect of the vibration of the microphone, moreover, also avoids the washer blocking the sound hole.

Figure 1:
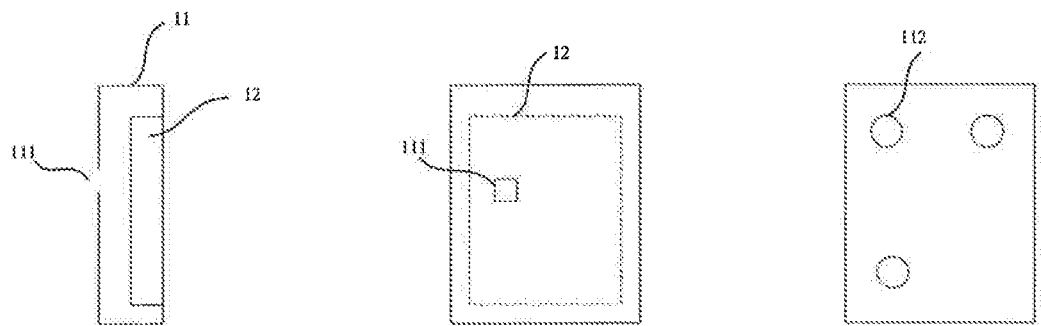
FIG. 1 shows the structural drawing of side profile, front view and top view of MEMS microphone in the prior art.

LABEL DECLARATION OF ELEMENT 11 current package shell
111 current sound hole
112 current pin
12 current microphone chip
2 MEMS microphone
21 package shell
211 sound hole
22 microphone chip
221 acoustic and electric sensor
23 dustproof component
3 electronic equipment
31 printed circuit board
32 washer

SPECIFIC EMBODIMENTS

The following specific examples illustrate the embodiments of the present invention; the skilled in the art can easily understand other advantages and functions of the present invention through the content disclosed in the description.

Please refer to FIG. 2 to FIG. 5. Please be noted that the structure, the size, the proportion and so on described in the drawings of the description, only cooperate with the content disclosed in the description, for understanding and reading to the skilled in the art, not for limiting the implemented qualification of the invention, so there is no real technological significance, any modification of the structure, change of the proportion, or adjustment of the size, without affecting the effect and the purpose of the invention, is still in the protection range disclosed in the technical content of the invention. At the same time, this specification references such as "up", "down", "left", "right", "middle" and "a" and other words, which is easy to describe, only for understanding, rather than to define the implemented scope of the invention, its relative change or adjustment, with no substantive changes in technical content, also regards as implemented category of the invention.

Embodiment 1

Figure 2:
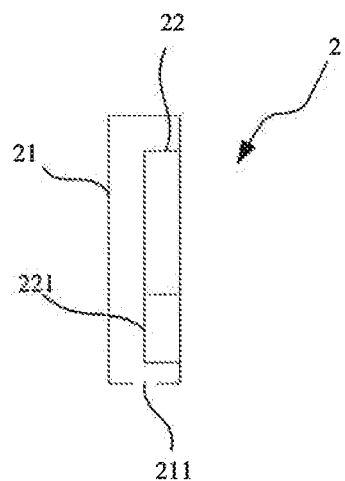
FIG. 2 shows the structural drawing of the MEMS microphone of the present invention.

As shown in FIG. 2, the present invention provides a MEMS microphone. The MEMS microphone 2 comprises a microphone chip 22 and a package shell 21.

The microphone chip 22 comprises: an acoustic and electric sensor 221, the microphone chip 22 is used to convert sound waves into change of plate spacing of capacitance in the acoustic and electric sensor 221, and output electric signal about the change of voltage according to the change of plate spacing. Wherein, the frequency of wave is in the wave band that the human ear can distinguish.

The package shell 21 packages the microphone chip 22, wherein, it is provided a sound hole 211 on the package shell 21, the sound hole 211 is positioned on the side face of the microphone chip 22, furthermore, it is provided pins derived from the microphone chip 22 on the side face of the package shell 21 adjacent to the sound hole 211. Wherein, the pin can be a needle pin or a patch type pin.

As an example, the bottom of the microphone chip 22 has three pins which extend to outside of the A surface of the package shell 21 and form patch type pins, the sound hole 211 is provided on the B surface of package shell 21, wherein, the A surface and the B surface is adjacent to each other, the sound hole 211 is located on the side face of the microphone chip 22.

Figure 3:
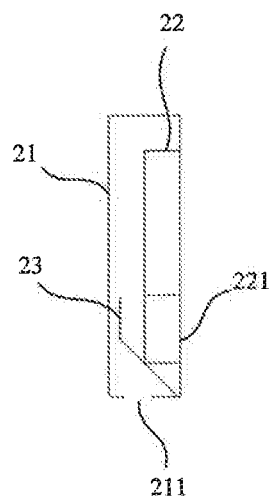
FIG. 3 shows the structural drawing of a preferred mode of the MEMS microphone of the present invention.

Preferably, as shown in FIG. 3, the MEMS microphone also comprises: a dust-proof component 23.

The dust-proof component 23 is over the acoustic and electric sensor 221. The dust-proof components 23 can be provided on the side of the sound hole 211, and aslant arranged over the acoustic and electric sensor 221; it can also be a hat shape, buckled over the acoustic and electric sensors 221. Preferably, the material of the dust-proof component 23 is siliceous material.

When the MEMS microphone is working, the sound hole 211 leads the external sound waves into the microphone chip 22, the acoustic and electric sensor 221 in the microphone chip 22 changes the plate spacing according to how the sound waves change, and output electric current whose amplitude change according to the change of plate spacing, the microphone chip 22 amplifies the electric current and then output it through the pins.

Embodiment 2

Figure 4:
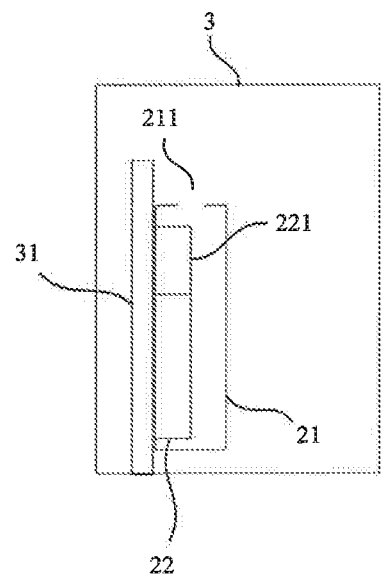
FIG. 4 shows the structural drawing of side profile of the electronic equipment having the MEMS microphone of the present invention.

As shown in FIG. 4, the present invention also provides an electronic equipment. The electronic equipment 3 comprises: the MEMS microphone 2 as described in the embodiment 1 and a printed circuit board 31. The printed circuit board 31 electrically connects with the pins of the MEMS microphone, to output the electric signal generated by the MEMS microphone to the audio processing unit (such as CPU, chip, etc.) of electronic equipment. Specifically, the printed circuit board 31 has the space for containing the MEMS microphone, wherein, the MEMS microphone's size is smaller than that of the space, in particular, leaving gap between the sound hole 211 of MEMS microphone and the boundary of the space, thus, the sound of the outside through the sound hole 211 on the electronic equipment and the gap into the sound hole 211 of the MEMS microphone, and the acoustic and electric sensor 221 turns the sound into audio signals.

Figure 5:
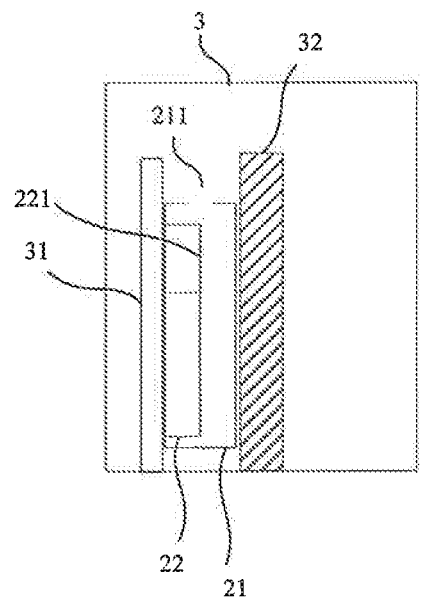
FIG. 5 shows the structural drawing of side profile of a preferred mode of electronic equipment having the MEMS microphone of the present invention.

Preferably, as shown in FIG. 5, the electronic equipment also comprises: a washer 32.

The washer 32 attaches to the package shell 21, and at the side face adjacent to the sound hole 211. Wherein, the material of the washer 32 is siliceous material.

For example, the washer 32 attaches to the side of the package shell 21 adjacent to the sound holes 211, the pins electrically connect to the printed circuit board 31 at the other side.

In summary, the MEMS microphone and the electronic equipment having the MEMS microphone of the present invention, by means of changing the position of the sound hole of the microphone, can avoid the sound air flow directly to the microphone chip, reduce dust interference on acoustic and electric sensor in microphone chip; also, since the change of position of sound hole of MEMS microphone, there is no need to retain the gap between the sound hole and the washer, it leads to the reduction of the space for MEMS microphone in electronic equipment, the reduction of the space not only shortens the transmission distance of sound waves in the air, but also develops the resonant frequency of acoustic and electric sensor, effectively increasing the conversion rate of audio quality; in addition, setting the dust-proof component over the sound hole can further reduce dust adhesion; moreover, the washer directly attached to the shell of MEMS microphone not only effectively reduces the size of the electronic equipment, but also enhances the protection effect of the vibration of the microphone, moreover, it also avoids the washer block the sound hole. Therefore, the present invention can effectively overcome the shortcomings in the prior art and it has a high industry utilization value. The above embodiments only exemplarily explain principle and effect of the present invention, not intending to limit the protection scope invention. Any skilled in the art can does violate modification or change on the embodiment in the spirit and scope of the invention. Therefore, all equivalent modification or change done by knowledge under the spirit and technical ideas disclosed by the invention, is belongs to the technical field of the claims of the invention.

The invention claimed is:

1. A microelectromechanical system (MEMS) microphone, characterized by, at least comprises:
    a microphone chip containing an acoustic and electric sensor, converting sound wave into change of plate spacing of capacitance in the acoustic and electric sensor, and output electric signal about the change of voltage according to the change of plate spacing;

a package shell packaging the microphone chip, wherein, it is provided a sound hole on the package shell, the sound hole is positioned on the side face of the microphone chip, it is also provided pins derived from the microphone chip on the side face of the package shell adjacent to the sound hole; and a dust-proof component attached over the acoustic and electric sensor wherein the dust-proof component is attached on a side of the sound hole and aslant arranged over the acoustic and electric sensor.

2. The MEMS microphone according to claim 1, characterized by, the material of the dust-proof component is siliceous material.

3. An electronic equipment having a microelectromechanical system (MEMS) microphone, characterized by, at least comprises: the MEMS microphone comprises: a microphone chip containing an acoustic and electric sensor, converting sound waves into change of plate spacing of capacitance in the acoustic and electric sensor, and output electric signal about the change of voltage according to the change of plate spacing; a package shell packaging the microphone chip, wherein, it is provided a sound hole on the package shell, the sound hole is positioned on the side face of the microphone chip, it is also provided pins derived from the microphone chip on the side face of the package shell adjacent to the sound hole; a dust-proof component attached over the acoustic and electric sensor wherein the dust-proof component is attached on a side of the sound hole and aslant arranged over the acoustic and electric sensor; and a printed circuit board electrically connecting with the pins of the MEMS microphone, to output the electric signal generated by the microphone.

4. The electronic equipment having the MEMS microphone according to claim 3, characterized by, the electronic equipment also comprises: a washer which is attached to the package shell and at the end face adjacent to the sound hole.

5. The electronic equipment having the MEMS microphone according to claim 3, characterized by, the material of the dust-proof component is siliceous material.

6. The electronic equipment having the MEMS microphone according to claim 3, characterized by, the Printed circuit board has space for containing the MEMS microphone, leaving gap between the sound hole of MEMS microphone and the boundary of the space.

* * * * *